(12) United States Patent
Muro et al.

(10) Patent No.: US 8,174,758 B2
(45) Date of Patent: May 8, 2012

(54) OPTICAL AMPLIFIER

(75) Inventors: Shinichirou Muro, Kawasaki (JP); Yuji Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 484 days.

(21) Appl. No.: 12/367,626

(22) Filed: Feb. 9, 2009

(65) Prior Publication Data

US 2009/0213455 A1 Aug. 27, 2009

(30) Foreign Application Priority Data

Feb. 26, 2008 (JP) ................... 2008-045198

(51) Int. Cl.
*H04B 10/17* (2006.01)
*H04B 10/12* (2006.01)
(52) U.S. Cl. ............ 359/341.4; 359/337.1; 359/341.1
(58) Field of Classification Search ............ 359/337.1, 359/341.1, 341.4
See application file for complete search history.

(56) References Cited

U.S. PATENT DOCUMENTS

| | | | |
|---|---|---|---|
| 6,055,092 A | 4/2000 | Sugaya et al. | |
| 2001/0043389 A1* | 11/2001 | Bonnedal et al. | 359/341.41 |
| 2002/0191276 A1* | 12/2002 | Onaka et al. | 359/341.2 |
| 2005/0225840 A1* | 10/2005 | Drasek et al. | 359/333 |

FOREIGN PATENT DOCUMENTS

| | | |
|---|---|---|
| JP | 5-291676 | 11/1993 |
| JP | 8-248455 | 9/1996 |

OTHER PUBLICATIONS

Fukushima et al., "Visible luminescence in 1480 nm high power pumped erbium-doped fiber amplifier", Optical Amplifiers and their applications Topical Meeting, OSA Trends in Optics and Photonics Series, vo. 16, pp. 173-176, (1997).*

* cited by examiner

*Primary Examiner* — Eric Bolda
(74) *Attorney, Agent, or Firm* — Staas & Halsey LLP

(57) ABSTRACT

An optical amplifier for amplifying light includes a light source for emitting pump light in accordance with current amount; a rare earth element doped optical fiber doped rare earth element, the rare earth element doped optical fiber pumped by the pump light from the light source; a detector for detecting upconversion light leaked from the rare earth element doped optical fiber; a memory for storing correspondence relationship data of the current amount for the light source and an intensity of the upconversion light in normal state of the light source; a difference calculator for calculating a difference between the intensity of the upconversion light being detected by the detector and an amount being obtained by converting the current amount for the light source by the use of the correspondence relationship data; and a discriminator for discriminating whether the difference calculated at the difference calculator exceeds a predetermined value.

7 Claims, 5 Drawing Sheets

| LD DRIVE CURRENT | PD OUTPUT CURRENT |
|---|---|
| 10 | 5 |
| 20 | 6 |
| 30 | 7 |
| 40 | 8 |
| . . . | . . . |

220

OPTICAL AMPLIFIER

CROSS-REFERENCE TO RELATED APPLICATIONS

This application is based upon and claims the benefit of priority of the prior Japanese Patent Application No. 2008-045198, filed on Feb. 26, 2008, the entire contents of which are incorporated herein by reference.

FIELD

The embodiments discussed herein are related to an optical amplifier for amplifying light.

BACKGROUND

In optical communications, signal light is transmitted via an optical fiber. Since power of the signal light drops when the signal light travels along the optical fiber by a long distance, an optical fiber amplifier is used to amplify the power. More specifically, the optical fiber amplifier amplifies signal light power by the use of the stimulated emission process using excited state rare-earth ions by inputting pump light into an optical fiber doped a rare-earth element (amplification medium).

Currently, optical fiber amplifiers having the amplification medium doped with erbium are gaining popularity. Such an amplification medium and such an optical fiber amplifier are respectively referred to as EDF (Erbium Doped Fiber) and EDFA (Erbium Doped Fiber Amplifier).

Japanese Laid-open Patent Publication No. 08-248455 discloses an optical fiber amplifier in which two stages of EDF are arranged with a variable optical attenuator inserted therebetween. Such a two-staged EDF optical fiber amplifier design is a widely used structure.

The above-described two-staged EDF of optical fiber amplifier performs an efficient amplification operation by receiving different pump lights at respective stages.

More specifically, a first-stage EDF (at a signal input side) receives an pump light falling within a 0.98 µm band that is excellent in noise characteristics but low in amplification efficiency, and a second-stage EDF (at a signal output side) receives an pump light falling within a 1.48 µm band that has a high amplification efficiency.

Such pump light are generated by a pump light source such as an LD (Laser Diode). Such a pump light source continuously outputs a pump light at a substantially high power within a range of 100 mW—several hundreds mW in response to a current flowing therethrough. The pump light source fatigues more quickly than other optical components. Output power of the pump light source drops gradually.

The EDFA largely changes in characteristics as an optical amplifier depending on the output power of the pump light incident on the EDF. When the output power drops below a lower limit thereof, replacing steps are preferably taken, for example, by replacing the light excitation source with a new one, or by replacing one component. For example, the output power of the pump light may be initially 300 mW with a current of certain value flowing through the pump light source. If the output power starts to drop later on and only an output power lower than 150 mW is obtained even with the same current flowing (also in the case of a trouble in which the output power suddenly drops to zero mW), it is determined that the pump light source suffers from a performance deterioration.

If the output power of the pump light within the 1.48 µm band directed to the second EDF drops in the two-staged EDFA, the output level of the signal light also drops. Therefore, the output level of the second stage signal light is monitored, and when the output level drops below a predetermined lower limit, it is determined that the pump light source suffers from a performance deterioration.

In contrast, if a drop takes place in the output power of the pump light within the 0.98 µm band directed to the first EDF, noise characteristics as an optical amplifier are deteriorated, but the output level of the signal light output from the first stage is not so largely affected. For this reason, even if the output level of the signal light from the first stage is monitored, it is difficult to determine whether the pump light source is degraded.

Available as another determination method is the use of back power monitor provided by the LD. However, currently, particularly, the accuracy of the back monitor of the LD with an FBG (Fiber Bragg Grating) is low, and unstable depending on a polarized wave state of the pump light, etc. Because of this, there are times when the amplifier is determined to be degraded even though the LD is not actually degraded.

In another method, branching part of the pump light, such as a beam splitter, is arranged immediately subsequent to the output of the LD, and the output power of the branched pump light is directly monitored. With this method, the deterioration determination is performed. However, costs for mounting the branching means are required, and the LD needs to output extra power for branching the pump light. Costs for installing such an LD are additionally needed.

SUMMARY

According to an aspect of the invention, an optical amplifier includes a light source for emitting pump light in accordance with current amount; a rare earth element doped optical fiber doped with rare earth element, the rare earth element doped optical fiber pumped by the pump light from the light source; a detector for detecting upconversion light leaked from the rare earth element doped optical fiber; a memory for storing correspondence relationship data of the current amount for the light source and an intensity of the upconversion light in normal state of the light source; a difference calculator for calculating a difference between the intensity of the upconversion light being detected by the detector and an amount being obtained by converting the current amount for the light source by the use of the correspondence relationship data; and a discriminator for discriminating whether the difference calculated at the difference calculator exceeds a predetermined value.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

An aspect of embodiments is to provide an optical amplifier to determine the deterioration of the pump light source mounted at a stage prior to a stage from which the signal light is output.

Embodiments of an optical fiber amplifier of the present invention are described below in detail with reference to the drawings.

Figure 1:
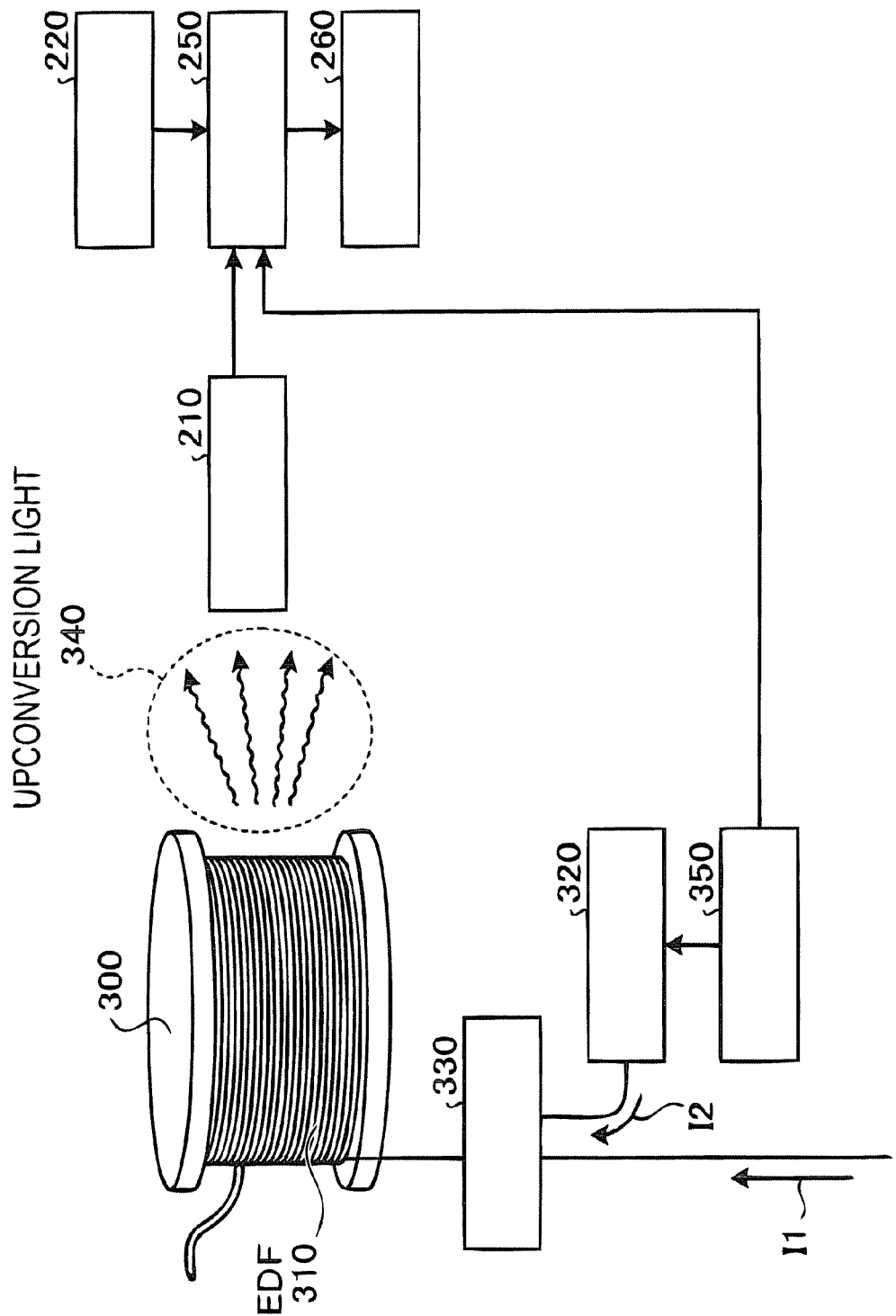
FIG. 1 illustrates a determination method of a deterioration of a pump light source.

Referring to FIG. 1, the principle of an optical fiber amplifier is described first. Wrapped round a bobbin 300 is an optical fiber (hereinafter referred to as EDF (Erbium Doped Fiber)) doped with erbium ions. Signal light (I1) to be amplified and 0.98 μm pump light (I2) generated by a pump light LD (Laser Diode) 320 are multiplexed by an optical coupler 330 and then incident on the EDF 310. In the EDF 310, erbium ions are excited by the 0.98 μm pump light, and the light signal is then incident on the excited erbium ions, thereby causing stimulated emission. As a result, the signal light is amplified.

When the signal light is amplified as illustrated, green light called up-conversion light 340 is observed in the EDF 310. This light is light emitted when some erbium ions excited at two stages by the pump light return to ground level.

The intensity of the up-conversion light 340 is proportional to the intensity of the pump light. If the pump light weakens, the number of erbium ions excited at two stages decreases, and the intensity of the up-conversion light 340 weakens.

The pump light LD 320 operates by a driving current flowing from an LD driver circuit 350, and emits pump light responsive to the driving current. Given the same driving current, the pump light LD 320, if degraded, can no longer emit the pump light at the same level.

If the intensity of the up-conversion light 340 responsive to the pump light emitted from the pump light LD 320 not yet degraded is stored, the degree of deterioration of the pump light LD 320 is determined with reference to the stored intensity. In accordance with the present embodiment, the deterioration of the pump light LD 320 is detected by monitoring the up-conversion light 340.

The deterioration detection method of the pump light LD 320 is continuously discussed. First, the pump light LD 320 is driven by the LD driver circuit 350 in no deterioration state before an actual service phase. With the driving current then changed, a plurality of driving current values are extracted as data.

Also, the intensity of the up-conversion light 340 leaking out of the EDF 310 is measured by a photo-detector 210. The measured values are then taken and stored in a mapping table 220 with the above described driving current values mapped thereto. In addition to the up-conversion light 340, the light leaking from the EDF 310 includes ASE (Amplified Spontaneous Emission) in a 1.55 .my.m band and the 0.98 .my.m pump light. A filter is preferably mounted to filter out these light rays in order to allow only the up-conversion light 340 to pass therethrough.

With the pump light LD 320 in service, the driving current flowing from the LD driver circuit 350 and the measurement values measured by the photo-detector 210 are constantly acquired. These two pieces of data acquired are input to a calculation circuit 250, which in turn calculates a difference between the measurement value mapped to the input driving current value in the mapping table and the input measurement value. If the calculated difference exceeds above a predetermined value, an pump light LD deterioration alarm unit 260 emits an alarm sound, thereby alerting a person to the deterioration of the pump light LD 320.

The up-conversion light 340 is equally observed as long as optical fibers doped with a rare-earth element are used. The present invention is not limited to erbium ions. The present invention is applicable to any optical fiber amplifier having as an amplification medium an optical fiber doped with a rare-earth element.

Figure 2:
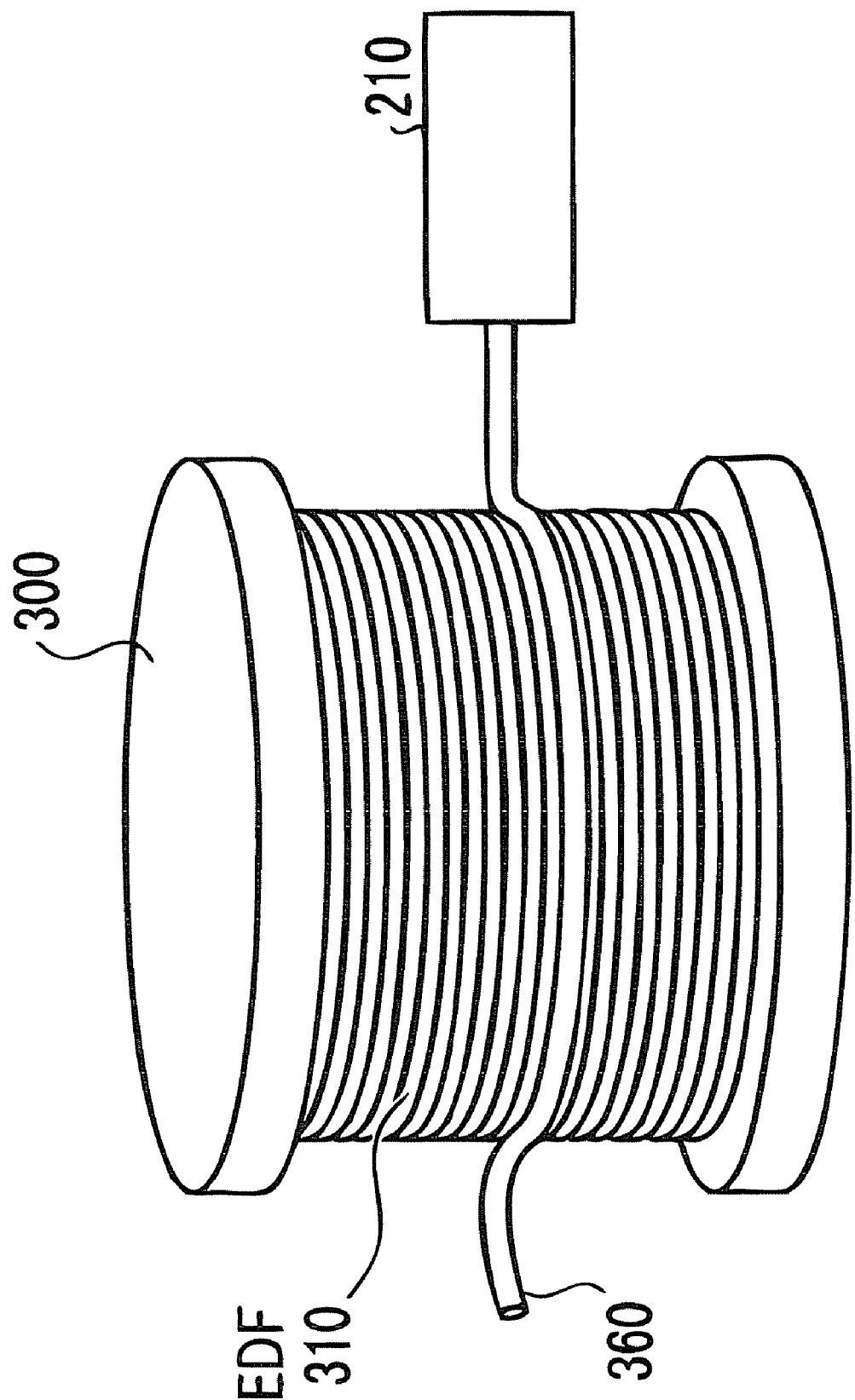
FIG. 2 illustrates a method of picking up up-conversion light with an optical fiber.

The up-conversion light 340 leaks out from the side of the EDF 310 wrapped around the bobbin 300 and then scattered in all directions. The up-conversion light 340 is thus preferably collected using a lens rather than directly collected. Furthermore, as illustrated in FIG. 2, another optical fiber 360 is routed along the side of the EDF, and leaked light is allowed to be picked up by the optical fiber 360 and then similarly directed to the photo-detector 210 (the other end is terminated). If the routed optical fiber 360 is deviated in position, for example, due to vibration, the intensity of the up-conversion light measured by the photo-detector 210 varies. The optical fiber 360 is thus preferably secured with an adhesive agent such as a UV (Ultraviolet rays) resin.

The notification of the deterioration of the pump light LD 320 is not limited to the alarm sound. Any type of notification is acceptable as long as a person in charge is notified. For example, information regarding the deterioration detection may be transmitted to a center.

The determination of the intensity of the up-conversion light 340 measured prior to the actual service of the pump light LD 320 is not limited to the determination based on the mapping relationship stored in the mapping table 220. An approximation equation is beforehand determined from the mapping relationship, and the intensity of the up-conversion light 340 is thus determined by substituting the driving current value into the approximation equation.

A general structure of the optical fiber amplifier including a pump light LD deterioration detector detecting a deterioration of the pump light LD through the above-described deterioration detection method is described below with reference to FIG. 3.

Figure 3:
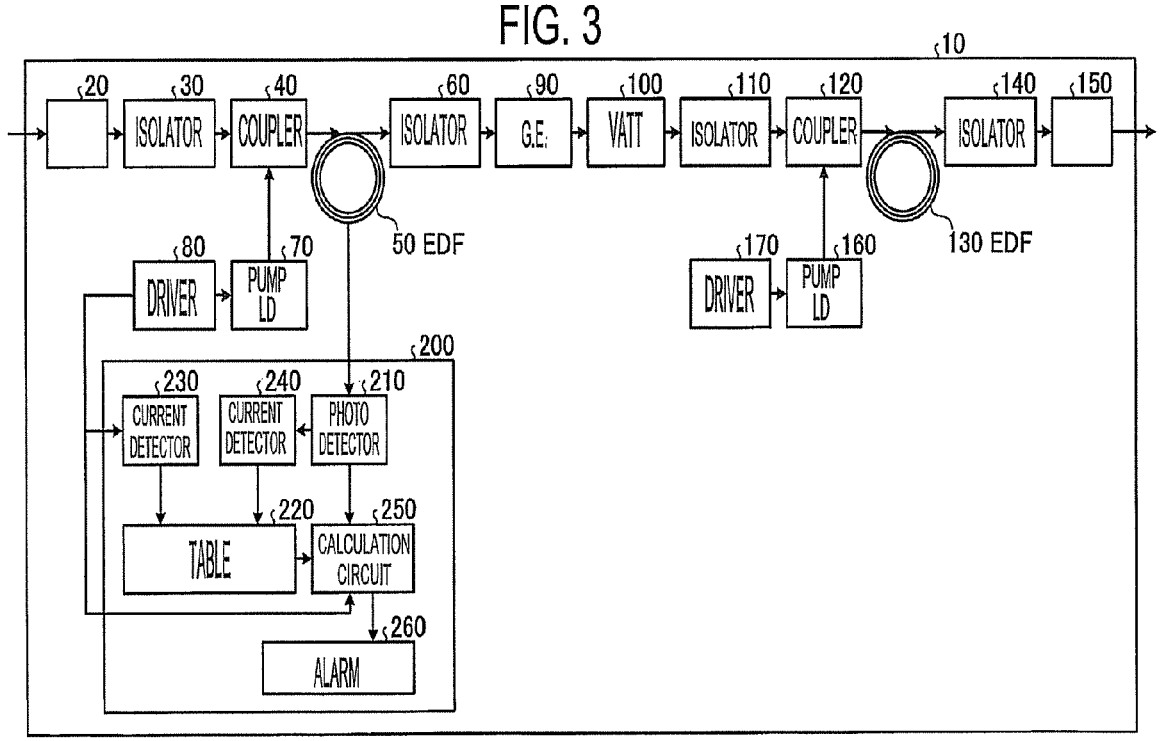
FIG. 3 diagrammatically illustrates an optical fiber amplifier.

FIG. 3 illustrates the general structure of the optical fiber amplifier. As shown in FIG. 3, an optical fiber amplifier 10 has an optical connector 20 on the left-hand side of the page serving as an input terminal of the signal light and an optical connector 150 on the right-hand side of the page serving as an output terminal of the signal light. The optical fiber amplifier 10 includes, in succession to the optical connector 20 as the input terminal, an optical isolator 30 for suppressing oscillation, an optical coupler 40 for multiplexing the signal light and the pump light, an EDF 50 for amplifying the signal light, and an optical isolator 60 for suppressing oscillation, and further an pump light LD 70 for inputting the pump light to the optical coupler 40, and an LD driver circuit 80 for driving the pump light LD 70.

These elements form a front stage of the optical amplifier, and 0.98 μm pump light serves as the pump light. This arrangement improves noise characteristics and causes the signal light to be amplified at the front stage, and generally controls a deterioration in the noise characteristics of the whole optical fiber amplifier 10 (due to a loss in a subsequent gain equalizer 90 and variable optical attenuator 100).

In succession to the front stage, the optical fiber amplifier 10 includes the gain equalizer 90 for flattening multi-wave signal gain characteristics of the optical amplifier and the variable optical attenuator 100 for keeping multi-wave signal gain flat against input level variations of the signal light. Another successive stage of amplifier is arranged to compensate for the level drop of the signal light caused by the gain equalizer 90 and the variable optical attenuator 100.

More specifically, as in the front stage, the optical fiber amplifier 10 includes in succession to the variable optical attenuator 100 an optical isolator 110 for suppressing oscillation, an optical coupler 120 for multiplexing the signal light and the pump light, an EDF 130 for amplifying the signal light, and an optical isolator 140, connected to the optical connector 150. Further included are a pump light LD 160 for inputting the pump light to the optical coupler 120 and a LD driver circuit 170 for driving the pump light LD 160.

These elements form a back stage, and 1.48 μm pump light is used as the pump light. Since a high signal output power is typically required of the back stage, the 1.48 μm pump light is used. However, to improve noise characteristics, the 0.98 μm pump light may also be used.

The optical fiber amplifier 10 includes a pump light LD deterioration detector 200 for detecting a deterioration in the pump light LD 70 at the front stage.

The pump light LD deterioration detector 200 includes the photo-detector 210, the mapping table 220, a current detector 230, a current detector 240, the calculation circuit 250, and the pump light LD deterioration alarm unit 260.

The photo-detector 210 detects the up-conversion light leaking out of the EDF as a physical quantity. More specifically, the photo-detector 210, including an optical filter, blocks light having wavelengths other than the up-conversion light of 0.5 μm-0.6 μm with the optical filter, and detects the up-conversion light with a photo-diode. In this way, only the up-conversion light is incident on the photo-diode, causing a current responsive to the intensity of the light to flow through the photo-diode.

Figure 4:
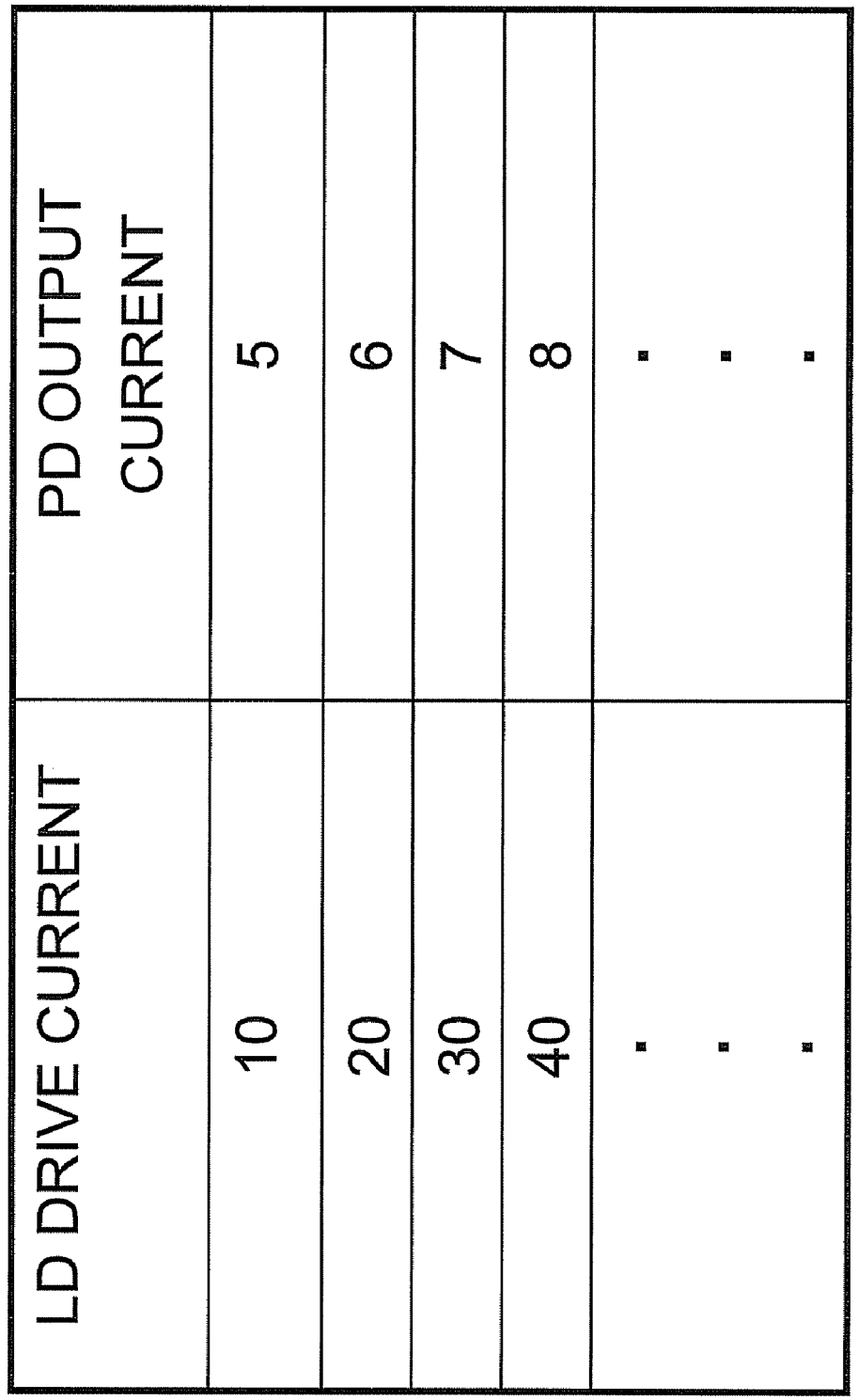
FIG. 4 illustrates an example of information registered in a mapping table.

The mapping table 220 stores as a plurality of different current value pairs the correspondence relationship between the value of the current flowing to operate the pump light LD in an undegraded state prior to actual service and the intensity of the up-conversion light emitted from the EDF in response to the pump light of the pump light LD supplied with the current. More specifically, as illustrated in FIG. 4, the mapping table 220 stores as the plurality of different current value pairs the correspondence relationship between the value of the current being an LD driving current value of the LD driver circuit and the light intensity being a photo-diode output current value.

The mapping table 220 is produced prior to the actual service of the optical fiber amplifier 10. The current the LD driver circuit supplies to the pump light LD is changed in intensity prior to the actual service of the optical fiber amplifier 10.

The current detector 230 acquires a plurality of LD driving current values from the LD driver circuit and registers the acquired LD driving current values in the mapping table 220.

The up-conversion light leaks out of the EDF in response to the pump light of the pump light LD, and a current flows through the photo-diode of the photo-detector 210 in response to the intensity of the light. The current detector 240 acquires a plurality of photo-diode output current values from the photo-detector 210 at the timing the current detector 230 acquires the LD driving current values, and then registers the acquired photo-diode output current values in the mapping table 220.

When the actual service of the optical fiber amplifier 10 starts, the deterioration detection of the pump light LD by the pump light LD deterioration detector 200 starts.

With the optical fiber amplifier 10 in service, the calculation circuit 250 calculates a difference between the photo-diode output current value corresponding to the value of the current actually flowing from the LD driver circuit to the pump light LD according to the mapping table 220 and the value of the current actually flowing through the photo-diode.

The pump light LD deterioration alarm unit 260 monitors the difference calculated by the calculation circuit 250, and emits an alarm sound if a predetermined value is exceeded. In this way, the maintenance person is alerted to a deterioration of the pump light LD 70.

Furthermore, the deterioration detection target of the pump light LD deterioration detector 200 is not limited to the pump light LD at the front stage in the two-staged optical fiber amplifier 10 illustrated in FIG. 3. In the case of a three-staged or higher-staged optical fiber amplifiers, pump light LDs at all the stages prior to the final stage from which the signal light is output may be deterioration detection targets.

Figure 5:
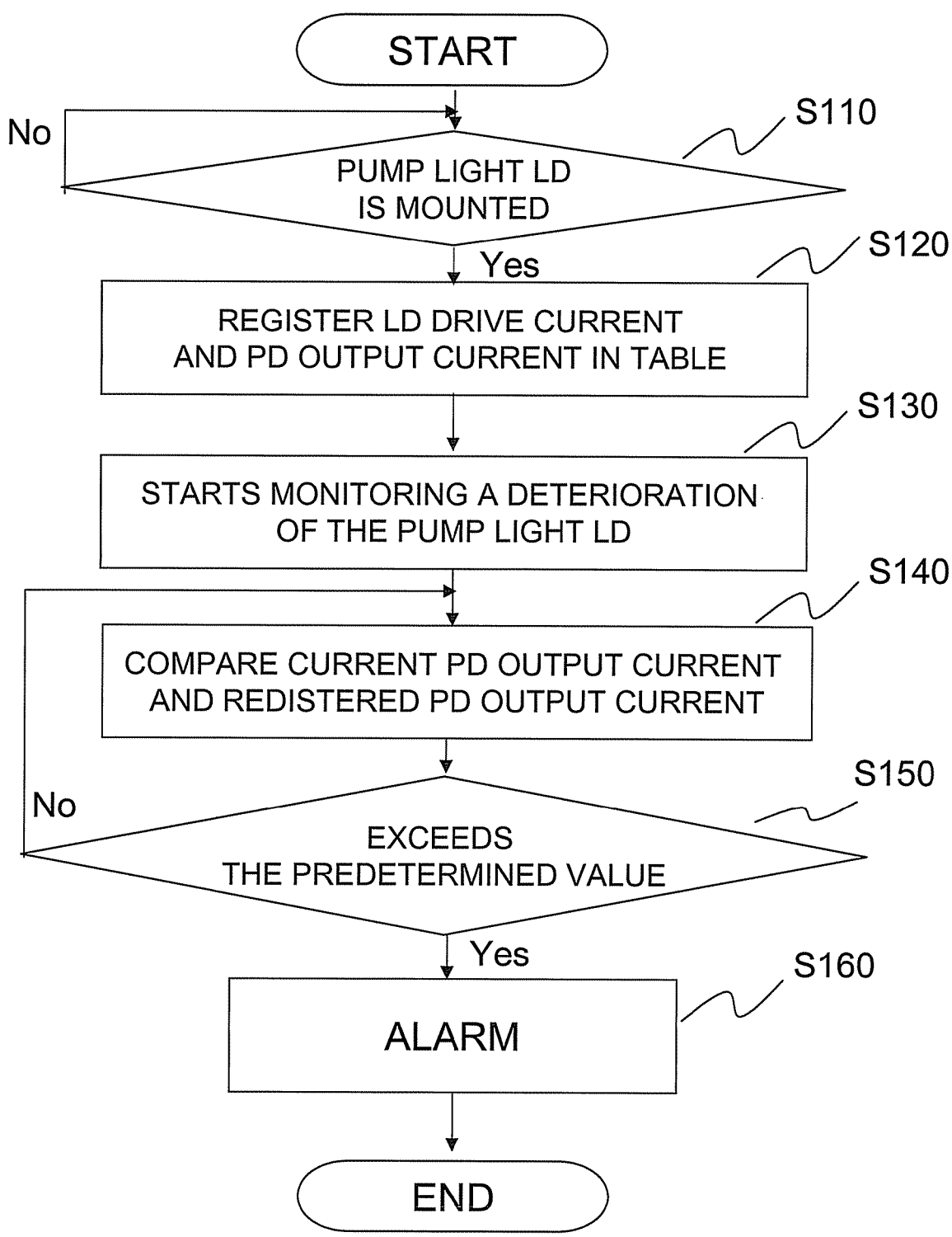
FIG. 5 is a flowchart illustrating the flow of a process of a pump light LD deterioration detector 200.

Lastly, with reference to FIG. 5, the flow of the process of the pump light LD deterioration detector 200 is described. FIG. 5 is a flowchart illustrating the flow of the process of the pump light LD deterioration detector 200.

If the pump light LD is mounted (yes in step S110), the current detector 230 and the current detector 240 register the correspondence relationship between the LD driving current value and the photo-diode output current value into the mapping table 220 (step S120).

When the actual service of the optical fiber amplifier 10 starts, the pump light LD deterioration detector 200 starts monitoring a deterioration of the pump light LD (step S130).

With the optical fiber amplifier 10 in service, the calculation circuit 250 calculates a difference between the value of the current actually flowing through the photo-diode and the photo-diode output current value corresponding to the value of the current actually flowing from the LD driver circuit to the pump light LD according to the mapping table 220. (step S140)

The pump light LD deterioration alarm unit 260 determines whether the difference exceeds the predetermined value (step S150). If it is determined that the difference exceeds the predetermined value (yes in step S150), the pump light LD deterioration alarm unit 260 emits an alarm sound (step S160). Processing thus ends.

In accordance with the above-described embodiments, the deterioration of the pump light source is detected. Also, cost reduction can be achieved in comparison with the method of detecting the deterioration by directly monitoring part of the pump light. Furthermore, relatively accurate detection is achieved in comparison with the method of monitoring the back power of the pump light source.

In the disclosed device, an intensity of up-conversion light drops if an output power of pump light drops. The intensity of the light of an pump light source is monitored during an operation thereof, and is compared with a light intensity that is obtained by measuring the output power of the pump light output by the pump light source that is not yet degraded in order to determine whether the pump light source is degraded. Even with multi-staged amplification media, it is determined whether the pump light source mounted at a stage prior to a stage from which the signal light is output is degraded or not.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An optical amplifier for amplifying light, comprising:
   a light source for emitting pump light in accordance with current amount;
   a rare earth element doped optical fiber doped with rare earth element, the rare earth element doped optical fiber pumped by the pump light from the light source;
   a detector for detecting upconversion light leaked from the rare earth element doped optical fiber;
   a memory for storing correspondence relationship data between an inputted current amount for the light source and a reference intensity of the upconversion light leaked from the rare earth element doped optical fiber pumped by a normal pump light, the normal pump light being emitted by the light source in normal state in accordance with the inputted current amount;
   a difference calculator for calculating a difference between an intensity of the upconversion light detected by the detector and the reference intensity of the upconversion light obtained from the memory on the basis of the current amount inputted to the light source by use of the correspondence relationship data; and
   a discriminator for discriminating whether the difference calculated at the difference calculator exceeds a predetermined value.

2. The optical amplifier of claim 1, further comprising a condenser for condensing the upconversion light from the rare earth element doped optical fiber, the condenser providing the upconversion light to the detector.

3. The optical amplifier of claim 1, further comprising an optical fiber for picking up leaked light including the upconversion light from the rare earth element doped optical fiber.

4. The optical amplifier of claim 1, further comprising a filter for filtering the upconversion light from the rare earth element doped optical fiber and for providing the upconversion light to the detector.

5. The optical amplifier of claim 1, wherein the rare earth element doped optical fiber is a plurality of optical fibers, the optical fibers being pumped by the pump lights having different wavelengths, respectively, at least one of the optical fibers being provided with the pump light having a wavelength causing the upconversion light to occur by the light source.

6. A method for detecting deterioration of a light source for pumping a rare earth element doped optical fiber for amplifying light, the method comprising:
   detecting upconversion light leaked from the rare earth element doped optical fiber;
   storing correspondence relationship data between an inputted current amount for the light source and an reference intensity of the upconversion light leaked from the rare earth element doped optical fiber pumped by a normal pump light, the normal pump light being emitted by the light source in normal state in accordance with the inputted current amount;
   calculating a difference between an intensity of the upconversion light detected by the detector and the reference intensity of the upconversion light obtained from the memory on the basis of the current amount inputted to the light source by use of the correspondence relationship data; and
   discriminating whether the difference calculated at the difference calculator exceeds a predetermined value.

7. The optical amplifier of claim 6, wherein said calculating is performed by a calculating circuit.

* * * * *

UNITED STATES PATENT AND TRADEMARK OFFICE
CERTIFICATE OF CORRECTION

PATENT NO.        : 8,174,758 B2
APPLICATION NO.   : 12/367626
DATED             : May 8, 2012
INVENTOR(S)       : Shinichirou Muro et al.

Page 1 of 1

It is certified that error appears in the above-identified patent and that said Letters Patent is hereby corrected as shown below:

Column 8, Line 32, delete "The optical amplifier of" and insert -- The method of --, therefor.

Signed and Sealed this
Eleventh Day of September, 2012

David J. Kappos
*Director of the United States Patent and Trademark Office*